United States Patent
Jang et al.

(10) Patent No.: US 12,238,957 B2
(45) Date of Patent: Feb. 25, 2025

(54) DISPLAY APPARATUS

(71) Applicant: Samsung Display Co., Ltd., Yongin-si (KR)

(72) Inventors: Wonho Jang, Yongin-si (KR); Sun Park, Yongin-si (KR); Donghyun Won, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 179 days.

(21) Appl. No.: 17/329,938

(22) Filed: May 25, 2021

(65) Prior Publication Data

US 2022/0045301 A1 Feb. 10, 2022

(30) Foreign Application Priority Data

Aug. 4, 2020 (KR) .................. 10-2020-0097539

(51) Int. Cl.
*H10K 50/844* (2023.01)
*H10K 59/122* (2023.01)

(52) U.S. Cl.
CPC ......... *H10K 50/844* (2023.02); *H10K 59/122* (2023.02)

(58) Field of Classification Search
CPC ........... H10K 51/5253; H10K 27/3276; H10K 27/3258; H10K 27/3246; H10K 2251/558; H10K 2251/566; H10K 59/124; H10K 59/122; H10K 59/131; H10K 50/844
See application file for complete search history.

(56) References Cited

U.S. PATENT DOCUMENTS

| 6,951,818 B2 | 10/2005 | Decre et al. |
| 8,334,545 B2 | 12/2012 | Levermore et al. |
| 9,070,600 B2 | 6/2015 | Katsui et al. |
| 2007/0002222 A1 | 1/2007 | Lim et al. |
| 2020/0083475 A1* | 3/2020 | Kang ............ H10K 50/84 |
| 2020/0119304 A1* | 4/2020 | Choi ............ H10K 59/12 |
| 2021/0143365 A1* | 5/2021 | Jo ............... H10K 50/844 |

FOREIGN PATENT DOCUMENTS

| CN | 109616510 | 4/2019 |
| JP | 4672238 | 4/2011 |
| KR | 10-1201310 | 11/2012 |
| KR | 10-1486180 | 1/2015 |

* cited by examiner

*Primary Examiner* — Vongsavanh Sengdara
(74) *Attorney, Agent, or Firm* — KILE PARK REED & HOUTTEMAN PLLC

(57) ABSTRACT

A display apparatus includes a substrate including a display area and a peripheral area, a thin film transistor including a semiconductor layer, a gate electrode, a source electrode, and a drain electrode, a first inorganic insulating layer located on the substrate and under the gate electrode and covering the semiconductor layer, a second inorganic insulating layer located on the first inorganic insulating layer and covering the gate electrode, a third inorganic insulating layer located on the second inorganic insulating layer and including a 1-3th opening in the peripheral area, an organic insulating layer located on the third inorganic insulating layer, covering the source electrode and the drain electrode, and including a second opening overlapping the 1-3th opening in the peripheral area, and a pattern portion located on a layer under the organic insulating layer and overlapping the 1-3th opening and the second opening.

15 Claims, 15 Drawing Sheets

DISPLAY APPARATUS

CROSS-REFERENCE TO RELATED APPLICATION(S)

This application claims priority to and benefits of Korean Patent Application No. 10-2020-0097539 under 35 U.S.C. § 119, filed on Aug. 4, 2020 in the Korean Intellectual Property Office, the entire contents of which are incorporated herein by reference.

BACKGROUND

1. Technical Field

One or more embodiments relate to a display apparatus for which the occurrence of defects in a manufacturing process or a use process after manufacturing may be minimized.

2. Description of the Related Art

From among display apparatuses, organic light emitting display apparatuses have attracted attention as the next-generation display apparatuses because they have the advantages of a wide viewing angle, excellent contrast, and fast response time. Such an organic light emitting display apparatus may be used as a display in a small product such as a mobile phone or may be used as a display in a large product such as a television.

Particularly, an organic light emitting display apparatus may be a self-luminous display apparatus that may include an organic light emitting device including a hole injection electrode, an electron injection electrode, and an organic emission layer formed therebetween. An organic light emitting display apparatus may generate light as excitons generated by the combination of holes injected from the hole injection electrode and electrons injected from the electron injection electrode in the organic emission layer fall from an excited state to a ground state.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In order to solve various problems of the related art, one or more embodiments may include a display apparatus for which the occurrence of defects in a manufacturing process or a use process after manufacturing may be minimized. However, these problems are merely examples and the scope of the disclosure is not limited thereto.

Additional aspects will be set forth in part in the description which follows and, in part, will be apparent from the description, or may be learned by practice of the presented embodiments.

According to one or more embodiments, a display apparatus may include a substrate including a display area and a peripheral area adjacent to the display area, a thin film transistor arranged in the display area and including a semiconductor layer, a gate electrode, a source electrode, and a drain electrode, a first inorganic insulating layer located on the substrate and under the gate electrode and covering the semiconductor layer, a second inorganic insulating layer located on the first inorganic insulating layer and covering the gate electrode, a third inorganic insulating layer located on the second inorganic insulating layer and including a 1-3th opening in the peripheral area, an organic insulating layer located on the third inorganic insulating layer, covering the source electrode and the drain electrode, and including a second opening overlapping the 1-3th opening in the peripheral area, and a pattern portion located on a layer under the organic insulating layer and overlapping the 1-3th opening and the second opening.

According to an embodiment, the pattern portion may include a first pattern layer arranged on the substrate, and the display apparatus may include a buffer layer located between the substrate and the first inorganic insulating layer and covering the first pattern layer in the peripheral area.

According to an embodiment, the semiconductor layer may be located on the buffer layer.

According to an embodiment, the second inorganic insulating layer may include a 1-2th opening overlapping the 1-3th opening in the peripheral area.

According to an embodiment, the first inorganic insulating layer may include a 1-1th opening overlapping the 1-2th opening and the 1-3th opening in the peripheral area.

According to an embodiment, the pattern portion may include a second pattern layer, and the second pattern layer and the gate electrode may be arranged on a same layer.

According to an embodiment, the second pattern layer and the gate electrode may include a same material.

According to an embodiment, the pattern portion may include a third pattern layer, and the third pattern layer, the source electrode, and the drain electrode may be located on a same layer.

According to an embodiment, the third pattern layer, the source electrode and the drain electrode may include a same material.

According to an embodiment, the display apparatus may further include a storage capacitor including a lower electrode integrated with the gate electrode, and an upper electrode located between the second inorganic insulating layer and the third inorganic insulating layer and overlapping the gate electrode, wherein the pattern portion may include a fourth pattern layer, and the fourth pattern layer and the upper electrode may be located on a same layer.

According to an embodiment, the fourth pattern layer and the upper electrode may include a same material.

According to an embodiment, the display apparatus may further include a pixel electrode electrically connected to the thin film transistor in the display area and located on the organic insulating layer, and a pixel definition layer located on the organic insulating layer over the display area and the peripheral area, wherein the pixel definition may include a third opening overlapping the 1-3th opening and the second opening in the peripheral area.

According to one or more embodiments, a display apparatus may include a substrate including a display area and a peripheral area adjacent to the display area, at least one inorganic insulating layer on the substrate, an organic insulating layer on the at least one inorganic insulating layer, an opening portion located in the peripheral area and including a first opening in the at least one inorganic insulating layer, and a second opening in the organic insulating layer. The display apparatus may include a pattern portion located in the peripheral area and overlapping the opening portion, wherein in a layer exposed by the opening portion, a distance from an upper surface of a portion overlapping the opening portion to an upper surface of the substrate may be greater than a distance from an upper surface of the portion not overlapping the opening portion to an upper surface of the substrate.

According to an embodiment, the at least one inorganic insulating layer may include at least one of a first inorganic insulating layer on the substrate, a second inorganic insulating layer on the first inorganic insulating layer, and a third inorganic insulating layer on the second inorganic insulating layer, wherein the first opening may include at least one of a 1-1st opening in the first inorganic insulating layer, a 1-2nd opening in the second inorganic insulating layer, and a 1-3rd opening in the third inorganic insulating layer.

According to an embodiment, the layer exposed by the opening portion is the first inorganic insulating layer, the second inorganic insulating layer or the third inorganic insulating layer.

According to an embodiment, the display apparatus may further include a thin film transistor located in the display area and including a semiconductor layer, a gate electrode, a source electrode, and a drain electrode, wherein the first inorganic insulating layer covers the semiconductor layer, the second inorganic insulating layer covers the gate electrode, and the third inorganic insulating layer covers the source electrode and the drain electrode.

According to an embodiment, the pattern portion may include at least one of a first pattern layer on the substrate, a second pattern layer on the first inorganic insulating layer, and a third pattern layer on the second inorganic insulating layer.

According to an embodiment, the display apparatus may further include a thin film transistor located in the display area and including a semiconductor layer, a gate electrode, a source electrode, and a drain electrode, wherein the second pattern layer and the gate electrode include a same material, and the third pattern layer, the source electrode, and the drain electrode include a same material.

According to an embodiment, the display apparatus may further include a storage capacitor including a lower electrode integrated with the gate electrode, and an upper electrode located between the second inorganic insulating layer and the third inorganic insulating layer and overlapping the gate electrode, wherein the pattern portion includes a fourth pattern layer, and the fourth pattern layer and the upper electrode may be located on a same layer.

According to an embodiment, the display apparatus may further include a pixel electrode on the organic insulating layer, wherein there may be no residual film including a same material as the pixel electrode on the layer exposed by the opening portion.

Other aspects, features, and advantages other than those described above will become apparent from the following detailed description, the appended claims, and the accompanying drawings.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
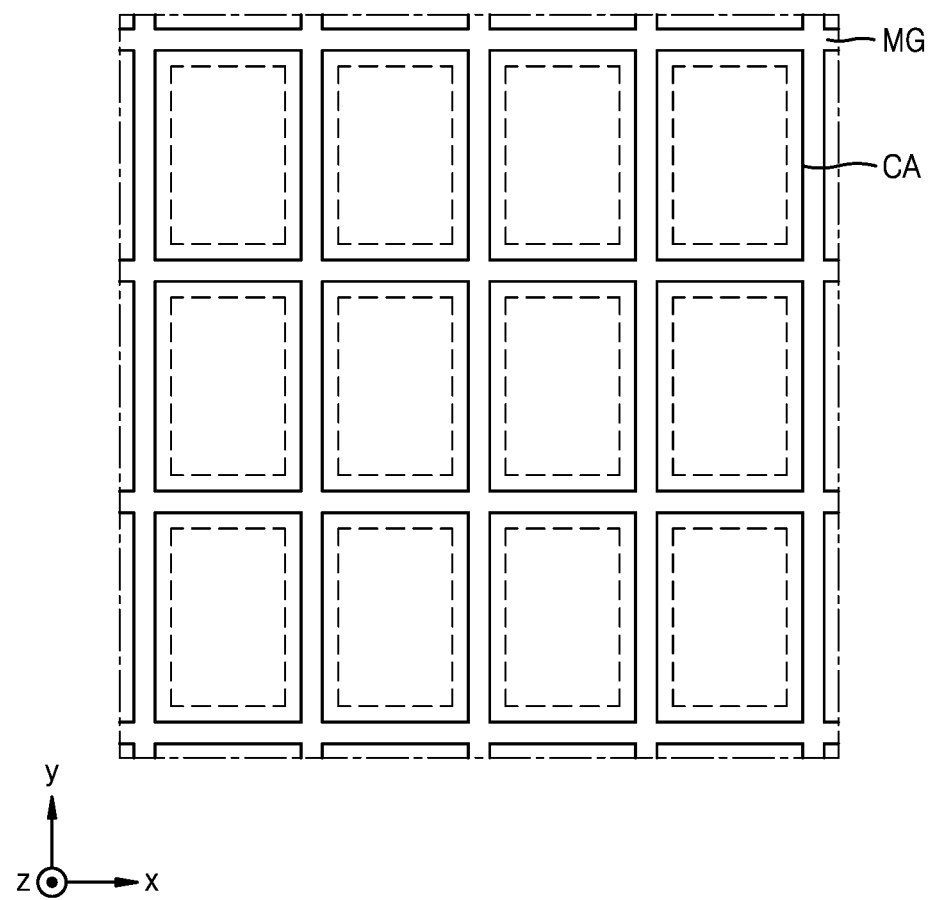
FIG. 1 is a plan view schematically illustrating a portion of a mother substrate according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

While such terms as "first" and "second" may be used to describe various components, such components should not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "has", "having", "include" and/or "including" as used herein specify the presence of stated features or components but do not preclude the addition of one or more other features or components.

It will be further understood that, when a layer, region, or component is referred to as being "on" another layer, region, or component, it may be directly or indirectly on another layer, region, or component. For example, intervening layers, regions, or components may be present.

Sizes of elements in the drawings may be exaggerated or reduced for convenience of description. For example, because sizes and thicknesses of elements in the drawings may be arbitrarily illustrated for convenience of description, the disclosure is not limited thereto.

When an embodiment may be implemented differently, a certain process order may be performed differently from the described order. For example, two consecutively described processes may be performed substantially at the same time or performed in an order opposite to the described order.

As used herein, "A and/or B" represents the case of A, B, or A and B. Also, "at least one of A and B" represents the case of A, B, or A and B.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

The term "overlap" may include layer, stack, face or facing, extending over, extending under, covering or partly covering or any other suitable term as would be appreciated and understood by those of ordinary skill in the art.

"Substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "substantially" may mean within one or more standard deviations, or within ±30%, 20%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a plan view schematically illustrating a portion of a mother substrate according to an embodiment.

As illustrated in FIG. 1, a mother substrate MG according to an embodiment may include multiple cell areas CA. Particularly, the mother substrate MG may include a substrate 100 (see FIG. 3) located in each of the multiple cell areas CA.

The mother substrate MG may be for manufacturing a display apparatus, and each of the cell areas CA may correspond to a display panel included in the display apparatus. The display apparatus may be an apparatus displaying a moving image or a still image and may be used as a display screen of various products such as televisions, notebook computers, monitors, billboards, and Internet of Things (IoT) as well as portable electronic apparatuses such as mobile phones, smart phones, tablet personal computers (PCs), mobile communication terminals, electronic notebooks, electronic books, portable multimedia players (PMPs), navigation, and Ultra Mobile PCs (UMPCs). Also, the display apparatus according to an embodiment may be used in wearable devices such as smart watches, watch phones, glasses-type displays, and head-mounted displays (HMDs).

Although FIG. 1 illustrates the mother substrate MG including the multiple cell areas CA for manufacturing a flat panel display apparatus, the display apparatus manufactured through the mother substrate MG of the disclosure may be a flexible display apparatus that may be flexible and thus may be easily bent, folded, or rolled. For example, the display apparatus may be a foldable display apparatus that may be folded and unfolded, a curved display apparatus in which a display surface may be curved, a bent display apparatus in which an area other than a display surface may be bent, or a rollable display apparatus that may be rolled or unfolded, or a stretchable display apparatus that may be stretched.

In an embodiment, the cell areas CA may be arranged in the mother substrate MG along a first direction (e.g., x direction) and/or a second direction (e.g., y direction) intersecting with the first direction. Although FIG. 1 illustrates a case where the first direction and the second direction are perpendicular to each other, the disclosure is not limited thereto. For example, the first direction and the second direction may form an acute angle or an obtuse angle therebetween.

As illustrated in FIG. 1, the sizes of the cell areas CA may be equal to each other on a plane (e.g., xy plane). However, the disclosure is not limited thereto, and the planar size of at least one cell area among the multiple cell areas CA may be different from the planar size of another cell area among the cell areas CA.

Multiple display panels may be manufactured by performing processes on the mother substrate MG to form devices corresponding to the multiple cell areas CA and performing a cutting process for division into each cell area CA. A polishing process may be performed on each of the cut display panels. In such a cutting process and polishing process, a physical external force may be transmitted to the display panels, and accordingly, a crack may occur outside the display panel. The crack may propagate into the display panel along an inorganic insulating layer located on the mother substrate MG. For example, inorganic insulating layers located on the substrate 100 (see FIG. 3) included in each display panel may provide a path through which the crack may propagate. According to embodiments described below, an opening may be formed for separation in some of the inorganic insulating layers to surround at least one side of a display area DA (see FIG. 2) in a peripheral area PA (see FIG. 2), thereby preventing or minimizing the propagation of the crack into the display panel.

Figure 2:
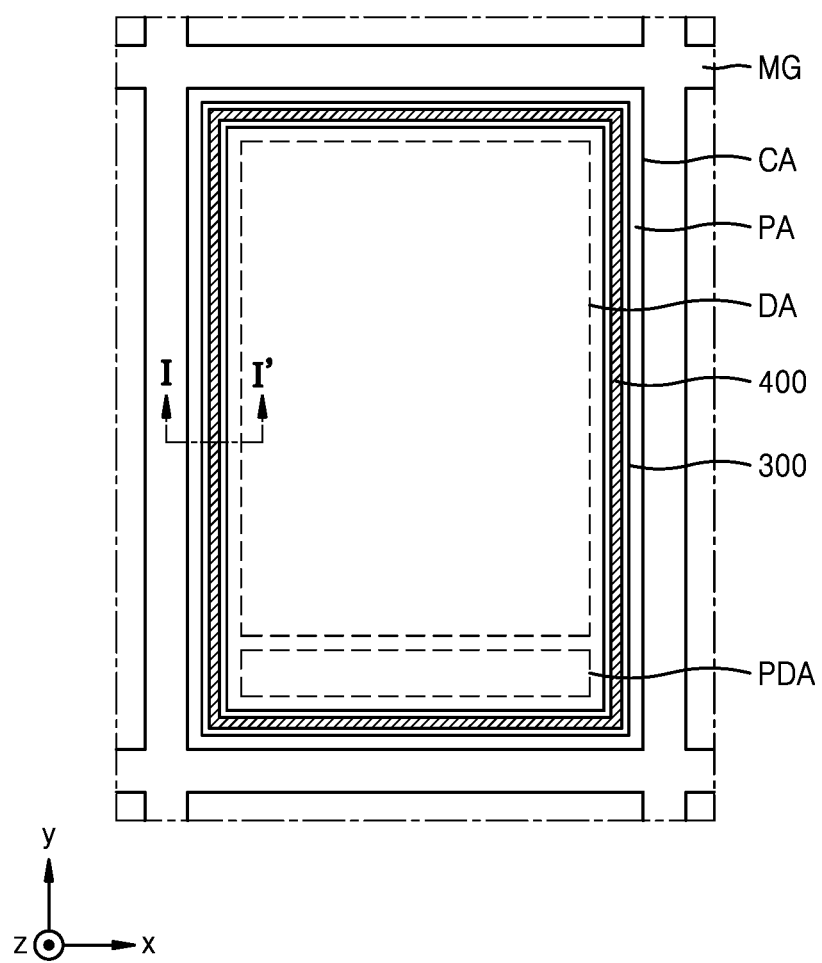
FIG. 2 is an enlarged schematic plan view of a cell area of the mother substrate of FIG. 1, according to an embodiment.

FIG. 2 is an enlarged schematic plan view of a cell area of the mother substrate of FIG. 1.

As illustrated in FIG. 2, each of the cell areas CA of the mother substrate MG according to an embodiment may include a display area DA that may emit light and a peripheral area PA that may not emit light. The peripheral area PA may be adjacent to (e.g., entirely surround) the display area DA. The substrate 100 (see FIG. 3) may include a first area corresponding to the display area DA and a second area corresponding to the peripheral area PA, and pixel circuits and display elements respectively electrically connected to the pixel circuits may be arranged in the first area of the substrate 100. Also, the peripheral area PA may include a pad area PDA on at least one side thereof.

FIG. 2 illustrates a display panel including a display area DA having a rectangular shape in the plan view. As illustrated in FIG. 2, the display area DA may have a rectangular planar shape having a short side in the first direction (x direction) and a long side in the second direction (y direction). An edge where the short side in the first direction (x direction) and the long side in the second direction (y direction) meet each other may be formed in a round shape to have a certain curvature or may be formed in a right angle. However, the planar shape of the display area DA is not limited thereto and may have other polygonal shapes, elliptical shapes, or irregular shapes.

Pixels may be located in the display area DA. The pixel may include a pixel circuit and a display element 200 (see FIG. 3) electrically connected to the pixel circuit. The display element 200 may be an organic light emitting diode (OLED) but is not limited thereto.

Various lines for transmitting electrical signals to be applied to the display area DA may be located in the peripheral area PA adjacent to (e.g., entirely surrounding) the display area DA. Also, a thin film transistor (not illustrated) may be included also in the peripheral area PA. The thin film transistor arranged in the peripheral area PA may be a portion of a circuit portion for controlling an electrical signal applied into the display area DA.

In an embodiment, the peripheral area PA may include a pad area PDA on one side thereof. A pad portion including multiple pads may be arranged on the pad area PDA. Each of the pads included in the pad portion may receive a signal input through a printed circuit board (PCB) by electrically contacting the pads of the printed circuit board (PCB) described below. For this purpose, the pad portion may include multiple pads. The pads may be exposed, without being covered by an insulating layer, to be electrically connected to the printed circuit board (PCB) or the like.

In other embodiments, the display panel may include a component (not illustrated) located on a side thereof. The component may include an electronic element using light or sound. For example, the electronic element may include a sensor such as an infrared sensor for receiving and using light, a camera for receiving light to acquire an image, a sensor for outputting and detecting light or sound to measure a distance or recognize a fingerprint or the like, a miniature lamp for outputting light, or a speaker for outputting sound.

An opening portion 300 may be arranged to be adjacent to (e.g., surround) at least a portion of the display area DA in the peripheral area PA. Although FIG. 2 illustrates that the opening portion 300 completely surrounds the left, right, upper, and lower sides of the display area DA when viewed in the plan view, the disclosure is not limited thereto. For example, the opening portion 300 may be variously modified such as to surround a portion of the left, right, upper, and lower sides of the display area DA when viewed in the plan view.

A pattern portion 400 may be arranged to be adjacent to (e.g., surround) at least a portion of the display area DA in the peripheral area PA. Particularly, the pattern portion 400 may overlap the opening portion 300 corresponding to an area where the opening portion 300 may be located.

Hereinafter, the components included in the display apparatus according to an embodiment will be described in more detail with reference to FIG. 3.

Figure 3:
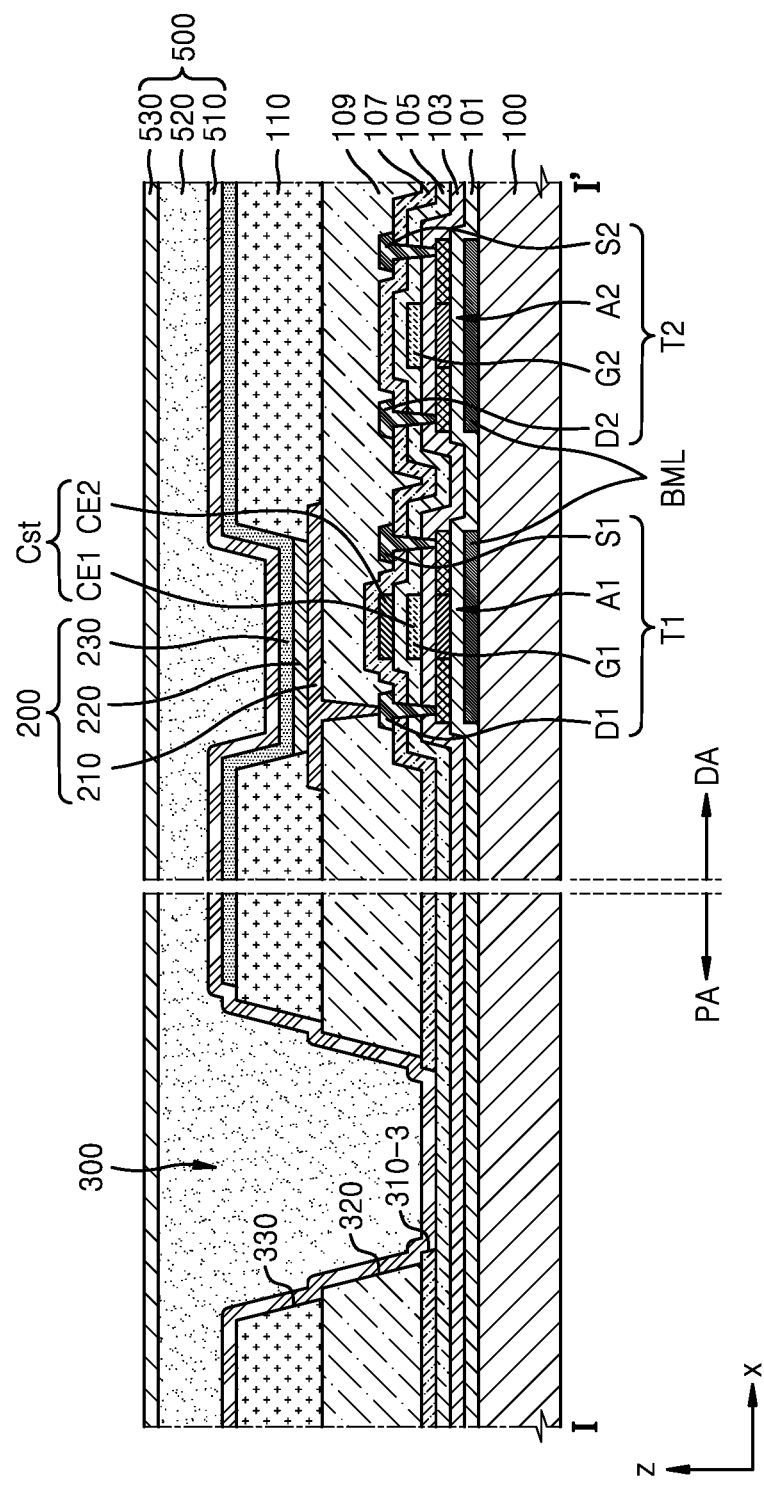
FIG. 3 is a schematic cross-sectional view of a display apparatus taken along line I-I' of FIG. 2, according to an embodiment.

FIG. 3 is a schematic cross-sectional view of a display apparatus taken along line II' of FIG. 2.

The substrate 100 may include glass, metal, polymer resin, or a combination thereof. In case that the substrate 100 is flexible or bendable, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. However, the substrate 100 may be variously modified such as including a multilayer structure including two layers including the polymer resin and a barrier layer located between the two layers and including an inorganic material (e.g., silicon oxide, silicon nitride, or silicon oxynitride).

A buffer layer 101 may be located on the substrate 100. The buffer layer 101 may include an inorganic material such as silicon oxide, silicon nitride, and/or silicon oxynitride and may have a single-layer or multi-layer structure. Also, the buffer layer 101 may be formed to extend in a display area and a non-display area. The buffer layer 101 may function to increase the smoothness of the upper surface of the substrate 100 or to prevent or minimize the penetration of impurities or moisture from outside of the substrate 100 into an active layer.

A pixel circuit may be located on the buffer layer 101 in the display area DA. In an embodiment, the pixel circuit included in each of the pixels located in the display area DA may include thin film transistors and a storage capacitor Cst. The number of thin film transistors included in each of the pixels is not limited and may be variously modified, such as from 2 to 7 thin film transistors. Each of the pixels may further include a capacitor as necessary.

Each of the thin film transistors may include a semiconductor layer, a gate electrode, a source electrode, and a drain electrode. Particularly, as illustrated in FIG. 3, a first thin film transistor T1 may include a first semiconductor layer A1, a first gate electrode G1, a first source electrode S1, and a first drain electrode D1, and a second thin film transistor T2 may include a second semiconductor layer A2, a second gate electrode G2, a second source electrode S2, and a second drain electrode D2. The first thin film transistor T1 may function as a driving thin film transistor electrically connected to a display element 200 to drive the display element 200. The second thin film transistor T2 may be electrically connected to a data line (not illustrated) to function as a switching thin film transistor. Hereinafter, detailed configurations of the display apparatus according to an embodiment will be described, which may be applied to at least one thin film transistor (e.g., T1, T2) included in the display apparatus.

The semiconductor layer may be located on the buffer layer 101 and may include amorphous silicon, polysilicon, or a combination thereof. As a particular example, the semiconductor layer may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). Also, the semiconductor layer may include a Zn oxide-based material such as a Zn oxide, an In—Zn oxide, a Ga—In—Zn oxide, or a combination thereof. Also, the semiconductor layer may include an In—Ga—Zn—O (IGZO), In—Sn—Zn—O (ITZO), In—Ga—Sn—Zn—O (IGTZO), or a combination thereof semiconductor containing a metal such as indium (In), gallium (Ga), or stannum (Sn) in ZnO. The semiconductor layer may include a source area and a drain area doped with impurities on both sides of a channel area.

The gate electrode may be located over the semiconductor layer to overlap at least a portion of the semiconductor layer. The gate electrode may include various conductive materials including molybdenum (Mo), aluminum (Al), copper (Cu), titanium (Ti), or the like, or a combination thereof, and may have various layered structures. For example, the gate electrode may include a Mo layer and an Al layer or may have a multilayer structure of Mo/Al/Mo. Also, in an embodiment, the gate electrode may have a multilayer structure including an ITO layer covering a metal material.

The source electrode and the drain electrode may also include various conductive materials including molybdenum (Mo), aluminum (Al), copper (Cu), titanium (Ti), or the like and may have various layered structures. For example, the source electrode and the drain electrode may include a Ti layer and an Al layer or may have a multilayer structure of Ti/Al/Ti. The source electrode and the drain electrode may be connected to the source area or the drain area of the semiconductor layer through a contact hole. Also, in an embodiment, the source electrode and the drain electrode may have a multilayer structure including an ITO layer covering a metal material.

Moreover, in order to secure the insulation between the semiconductor layer and the gate electrode, a first inorganic insulating layer 103 may be located between the semiconductor layer and the gate electrode. For example, the first inorganic insulating layer 103 may be located over the substrate 100 and under the gate electrode and may cover the semiconductor layer. The first inorganic insulating layer 103 may be an insulating layer including an inorganic material such as silicon oxide, silicon nitride, and/or silicon oxynitride.

A second inorganic insulating layer 105 may be located on the first inorganic insulating layer 103 to cover the gate electrode. The second inorganic insulating layer 105 may be an insulating layer including an inorganic material such as silicon oxide, silicon nitride, and/or silicon oxynitride.

The storage capacitor Cst may include a lower electrode CE1 and an upper electrode CE2.

The lower electrode CE1 may be electrically connected to the first gate electrode G1 of the first thin film transistor T1, and the upper electrode CE2 may be electrically connected to a driving voltage line (not illustrated). The lower electrode CE1 may be integrated with the first gate electrode G1. For example, the first gate electrode G1 may function not only as a control electrode of the first thin film transistor T1 but also as the lower electrode CE1 of the storage capacitor Cst. The storage capacitor Cst may maintain a voltage applied to the first gate electrode G1 by storing and maintaining a voltage corresponding to the voltage difference between the driving voltage line and the first gate electrode G1.

The upper electrode CE2 may overlap the lower electrode CE1 with the second inorganic insulating layer 105 therebetween. The second inorganic insulating layer 105 may function as a dielectric layer of the storage capacitor Cst. The upper electrode CE2 may include a conductive material including molybdenum (Mo), aluminum (Al), copper (Cu), titanium (Ti), or the like, or a combination thereof, and may include a single layer or a multiple layer including the above material. For example, the upper electrode CE2 may include a single Mo layer or a multiple layer of Mo/Al/Mo. Also, in an embodiment, the source electrode and the drain electrode may have a multilayer structure including an ITO layer covering a metal material.

A third inorganic insulating layer 107 may be located on the second inorganic insulating layer 105 to cover the upper electrode CE2 of the storage capacitor Cst. For example, the upper electrode CE2 may be located between the second inorganic insulating layer 105 and the third inorganic insulating layer 107. Also, a source electrode and a drain electrode may be located on the third inorganic insulating layer 107. The third inorganic insulating layer 107 may be an insulating layer including an inorganic material such as silicon oxide, silicon nitride, and/or silicon oxynitride.

A protection layer (not illustrated) may be located on the third inorganic insulating layer 107 to cover the source electrode and the drain electrode. The protection layer may be an insulating layer including an inorganic material such as silicon oxide, silicon nitride, and/or silicon oxynitride.

Moreover, the inorganic insulating layers 103, 105, and 107 including the inorganic material as described above may be formed through chemical vapor deposition (CVD), atomic layer deposition (ALD), or the like. However, the disclosure is not limited thereto.

Also, in an embodiment, at least one of the inorganic insulating layers may include an opening in the peripheral area PA. For example, in case that the uppermost inorganic insulating layer among the inorganic insulating layers located under the organic insulating layer 109 is the third inorganic insulating layer 107, the third inorganic insulating layer 107 may include a 1-3th opening 310-3 in the peripheral area PA. Accordingly, it may be possible to prevent a crack generated by an external force from propagating into the display panel in the manufacturing process or in the use process after manufacturing.

An organic insulating layer 109 may be located on the source electrode and the drain electrode. The organic insulating layer 109 may have a flat upper surface such that a pixel electrode 210 may be formed flat. The organic insulating layer 109 may include a single layer or a multiple layer formed of an organic material. The organic insulating layer 109 may include a general-purpose polymer such as benzocyclobutene (BCB), polyimide, hexamethyldisiloxane (HMDSO), polymethylmethacrylate (PMMA), polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

The organic insulating layer 109 may be arranged on the substrate 100 over the display area DA and the peripheral area PA outside the display area DA and may include a second opening 320 exposing the third inorganic insulating layer 107 in the peripheral area PA. Accordingly, it may be possible to prevent the impurities or the like penetrated from outside from reaching the inside of the display area DA through the organic material of the organic insulating layer 109.

In the display area DA of the substrate 100, the display element 200 may be located on the organic insulating layer 109. In case that the display element 200 is an organic light emitting diode, the display element 200 may include a pixel electrode 210, an opposite electrode 230, and an intermediate layer 220 located therebetween and including an emission layer.

The pixel electrode 210 may be electrically connected to the thin film transistor by contacting any one of the source electrode and the drain electrode through a contact hole formed in the organic insulating layer 109 or the like. The pixel electrode 210 may be a (semi)light-transmissive electrode or a reflective electrode. In some embodiments, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or semitransparent electrode layer on the reflective film. The transparent or semitransparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have an ITO/Ag/ITO stack structure.

A pixel definition layer 110 may be located over the organic insulating layer 109 across the display area DA and the peripheral area PA. The pixel definition layer 110 may function to define a pixel (or an emission area) by having an opening corresponding to each of the pixels. In this regard, the opening may be formed to expose at least a portion of a central portion of the pixel electrode 210.

The pixel definition layer 110 may prevent an arc or the like from occurring at the edge of the pixel electrode 210 by increasing a distance between the edge of the pixel electrode 210 and the opposite electrode 230 arranged above the pixel electrode 210. The pixel definition layer 110 may include one or more organic insulating materials selected from the group including polyamide, polyimide, acrylic resin, BCB, and phenolic resin and may be formed by a method such as spin coating.

Moreover, the pixel definition layer 110 may include a third opening 330 formed to overlap the openings included in the opening portion 300. For example, the opening portion 300 may include the third opening 330 formed in the pixel definition layer 110 in the peripheral area PA. For example, the pixel definition layer 110 may include the third opening 330 formed to overlap the 1-3th opening 310-3 formed in the third inorganic insulating layer 107 and the second opening 320 formed in the organic insulating layer 109. Accordingly, it may be possible to prevent the impurities or the like penetrated from outside from flowing through the pixel definition layer 110, thereby preventing or reducing the degradation of the quality of an image implemented in the display apparatus.

The intermediate layer 220 may include a low molecular weight or high molecular weight material. In case that the intermediate layer 220 includes a low molecular weight material, the intermediate layer 220 may include a structure in which a hole injection layer (HIL), a hole transport layer (HTL), an emission layer (EML), an electron transport layer (ETL), an electron injection layer (EIL), and the like may be stacked in a single or complex structure and may be formed by vacuum deposition. In case that the intermediate layer 220 includes a high molecular weight material, the intermediate layer 220 may include a structure including a hole transport layer (HTL) and an emission layer (EML). In this regard, the HTL may include poly(3,4-ethylenedioxythiophene) (PEDOT), and the EML may include a polymer material such as a polyphenylene vinylene (PPV)-based material, a polyfluorene-based material, etc. or a combination thereof. The intermediate layer 220 may be formed by screen printing, inkjet printing, deposition, or laser induced thermal imaging (LITI). However, the intermediate layer 220 is not limited thereto and may have various structures.

The intermediate layer 220 may include a layer patterned to correspond to each of the pixels as illustrated in FIG. 3 or may include a layer integrated over multiple pixels.

The opposite electrode 230 may be located over the display area DA. As an example, the opposite electrode 230 may include an integral layer to cover an entire surface of the display area and may be arranged over the display area. For example, the opposite electrode 230 may be integrally formed in multiple pixels to correspond to multiple pixel electrodes 210. The opposite electrode 230 may be formed to cover the display area DA and extend to a portion of the peripheral area PA outside the display area DA. As another example, the opposite electrode 230 may be patterned to correspond to each of multiple pixel electrodes 210.

The opposite electrode 230 may be a light-transmissive electrode or a reflective electrode. In some embodiments, the opposite electrode 230 may be a transparent or semitransparent electrode and may include a metal thin film having a small work function including lithium (Li), calcium (Ca), lithium fluoride/calcium (LiF/Ca), lithium fluoride/aluminum (LiF/Al), aluminum (Al), silver (Ag), magnesium (Mg), or a compound thereof. In addition to the metal thin film, a transparent conductive oxide (TCO) film such as ITO, IZO, ZnO, or $In_2O_3$ may be further included.

Because the organic light emitting device may be easily damaged by the moisture or oxygen from outside, an encapsulation layer 500 may cover and protect the organic light emitting device for protection. The encapsulation layer 500 may cover the display area DA and extend to outside of the display area DA. The encapsulation layer 500 may include a first inorganic encapsulation layer 510, an organic encapsulation layer 520, and a second inorganic encapsulation layer 530.

The first inorganic encapsulation layer 510 may cover the opposite electrode 230 and may include silicon oxide, silicon nitride, silicon oxynitride, and/or the like. In case necessary, other layers such as a capping layer may be located between the first inorganic encapsulation layer 510 and the opposite electrode 230. Because the first inorganic encapsulation layer 510 may be formed along the structure thereunder, the upper surface thereof may not be flat.

The organic encapsulation layer 520 may cover the first inorganic encapsulation layer 510, and the upper surface thereof may be substantially flat unlike the upper surface of the first inorganic encapsulation layer 510. Particularly, the upper surface of the organic encapsulation layer 520 may be substantially flat at a portion corresponding to the display area DA. The organic encapsulation layer 520 may include at least one of polyethylene terephthalate, polyethylene naphthalate, polycarbonate, polyimide, polyethylene sulfonate, polyoxymethylene, polyarylate, and hexamethyldisiloxane.

The second inorganic encapsulation layer 530 may cover the organic encapsulation layer 520 and may include silicon oxide, silicon nitride, silicon oxynitride, and/or the like. The second inorganic encapsulation layer 530 may contact the first inorganic encapsulation layer 510 at the edge thereof located outside the display area DA such that the organic encapsulation layer 520 may not be exposed to the outside.

As such, the encapsulation layer 500 may include the first inorganic encapsulation layer 510, the organic encapsulation layer 520, and the second inorganic encapsulation layer 530, and even in case that a crack occurs in the encapsulation layer 500 through such a multilayer structure, it may be possible to prevent the crack from being extended between the first inorganic encapsulation layer 510 and the organic encapsulation layer 520 and between the organic encapsulation layer 520 and the second inorganic encapsulation layer 530. Accordingly, the formation of a path through which the moisture or oxygen from outside penetrates into the display area DA may be prevented or minimized.

The opening portion 300 may surround at least a portion of the display area DA in the peripheral area PA. In an embodiment, the opening portion 300 may include a first opening 310 formed in at least a portion of the inorganic insulating layers, a second opening 320 formed in the organic insulating layer 109, and a third opening 330 formed in the pixel definition layer 110. The first opening 310, the second opening 320, and the third opening 330 may overlap each other when vertically viewing the substrate 100.

The area where the opening portion 300 may be located may form a deep valley compared with the areas where the opening portion 300 may not be located, and there may be a problem in that it may be difficult for the exposure energy to be sufficiently transmitted to the bottom surface of the opening portion 300 in the exposure process using a photoresist. Here, "the bottom surface of the opening portion 300" may mean the upper surface of the layer exposed by the opening portion 300. For example, a pixel electrode material residual film 211 (see FIG. 9) may remain on the upper surface of the inorganic insulating layer exposed by the opening portion 300 in the exposure process of patterning the pixel electrode 210, thus causing a defect in the manufacturing process or in the use process after manufacturing. The pixel electrode material residual film 211 and the pixel electrode 210 may include a same material and may have an ITO/Ag/ITO stack structure. In case that the Ag layer of the pixel electrode material residual film 211 is not completely covered by the ITO layer and there is a pinhole defect or the like, the Ag particles may leak and flow into the display area DA, thus causing a defect such as a short circuit. Hereinafter, an example of the process in which the pixel electrode material residual film 211 occurs will be described with reference to FIGS. 4 to 9.

FIGS. 4 to 9 are cross-sectional views schematically illustrating an example of a processing process in which a pixel electrode material residual film occurs.

Figure 4:
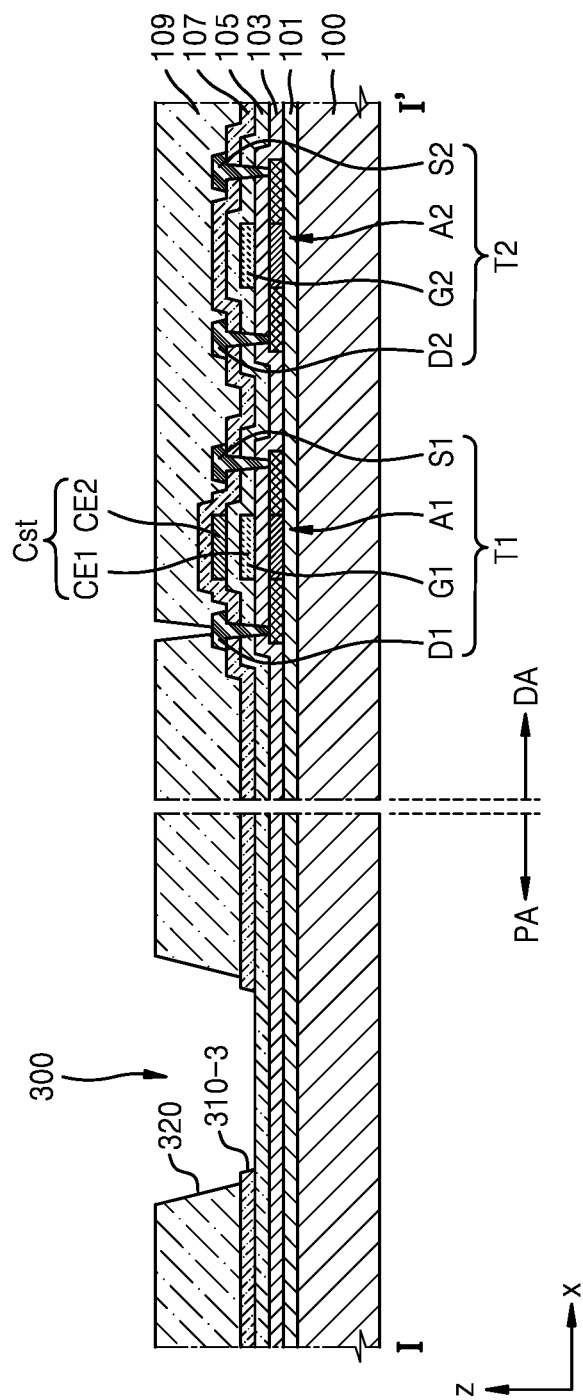
FIGS. 4 to 9 are cross-sectional views schematically illustrating an example of a processing process in which a pixel electrode material residual film occurs, according to an embodiment.

As illustrated in FIG. 4, the thin film transistors T1 and T2 and the storage capacitor Cst may be formed in the display area DA, and the organic insulating layer 109 may be formed to cover the thin film transistors T1 and T2.

The buffer layer 101 may be located on the substrate 100. The first inorganic insulating layer 103 may be located on the buffer layer 101 and under the gate electrodes G1 and G2 and may cover the semiconductor layers A1 and A2. The second inorganic insulating layer 105 may be located on the first inorganic insulating layer 103 and may cover the gate electrodes G1 and G2. The third inorganic insulating layer 107 may be located on the second inorganic insulating layer 105 and may cover the upper electrode CE2. The organic insulating layer 109 may be located on the third inorganic insulating layer 107 and may cover the source electrodes S1 and S2 and the drain electrodes D1 and D2.

Moreover, the opening portion 300 may be located in the peripheral area PA. The opening portion 300 may include the first opening 310 formed in at least one of the organic insulating layer 109 and the inorganic insulating layers 103, 105, and 107. Although FIGS. 4 to 9 illustrate a case where the third inorganic insulating layer 107 may include the 1-3th opening 310-3 and the organic insulating layer 109 may include the second opening 320, the disclosure is not limited thereto. For example, the second inorganic insulating layer 105 may include a 1-2th opening 310-2, the third inorganic insulating layer 107 may include a 1-3th opening 310-3, and the organic insulating layer 109 may include a second opening 320. For example, the first inorganic insulating layer 103 may include a 1-1th opening 310-1, the second inorganic insulating layer 105 may include a 1-2th opening 310-2, the third inorganic insulating layer 107 may include a 1-3th opening 310-3, and the organic insulating layer 109 may include a second opening 320. Moreover, the 1-1th opening 310-1, the 1-2th opening 310-2, the 1-3th opening 310-3, and the second opening 320 may overlap each other.

Figure 5:
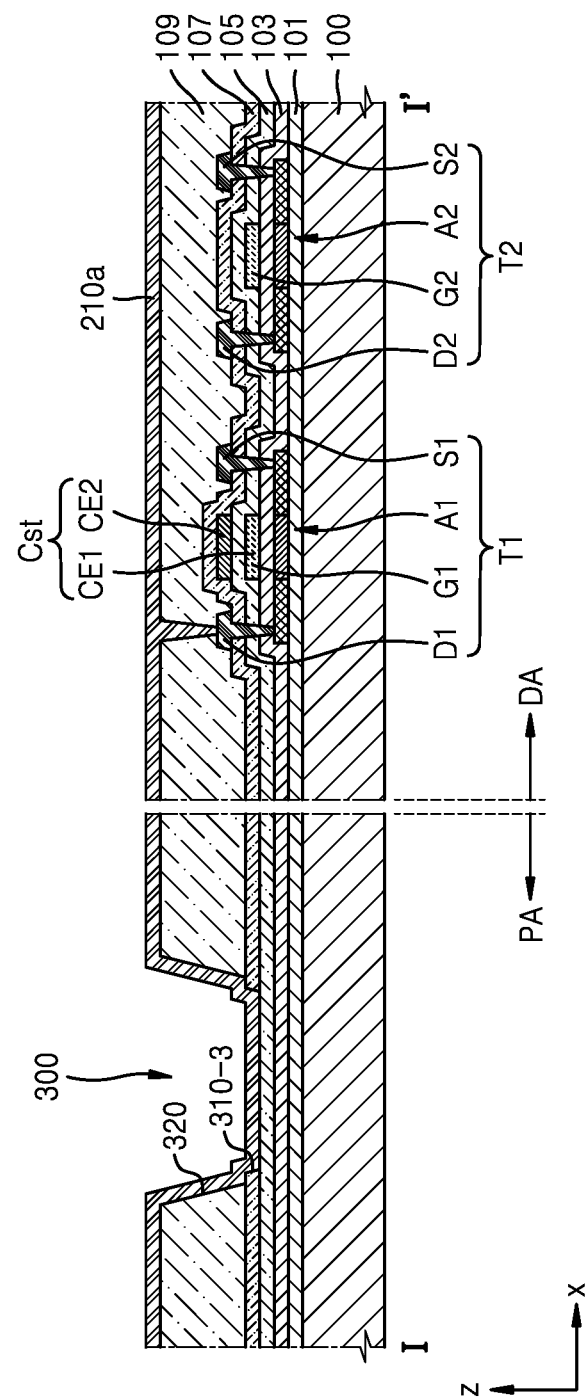

Subsequently, as illustrated in FIG. 5, a pixel electrode material 210a may be formed on the organic insulating layer 109 over the surface of the substrate 100.

The pixel electrode material 210a may cover the organic insulating layer 109 in the display area DA and may contact the first drain electrode D1 of the first thin film transistor T1 through the contact hole formed in the organic insulating layer 109. Also, the pixel electrode material 210a may cover the organic insulating layer 109 in the peripheral area PA and may cover the inner surface and the bottom surface of the opening portion 300. For example, as illustrated in FIG. 5, the pixel electrode material 210a may be formed to cover the inner surface of the 1-3th opening 310-3 formed in the third inorganic insulating layer 107 in the peripheral area PA, the inner surface of the second opening 320 formed in the organic insulating layer 109, and the upper surface of the second inorganic insulating layer 105 exposed through the opening portion 300.

Figure 6:
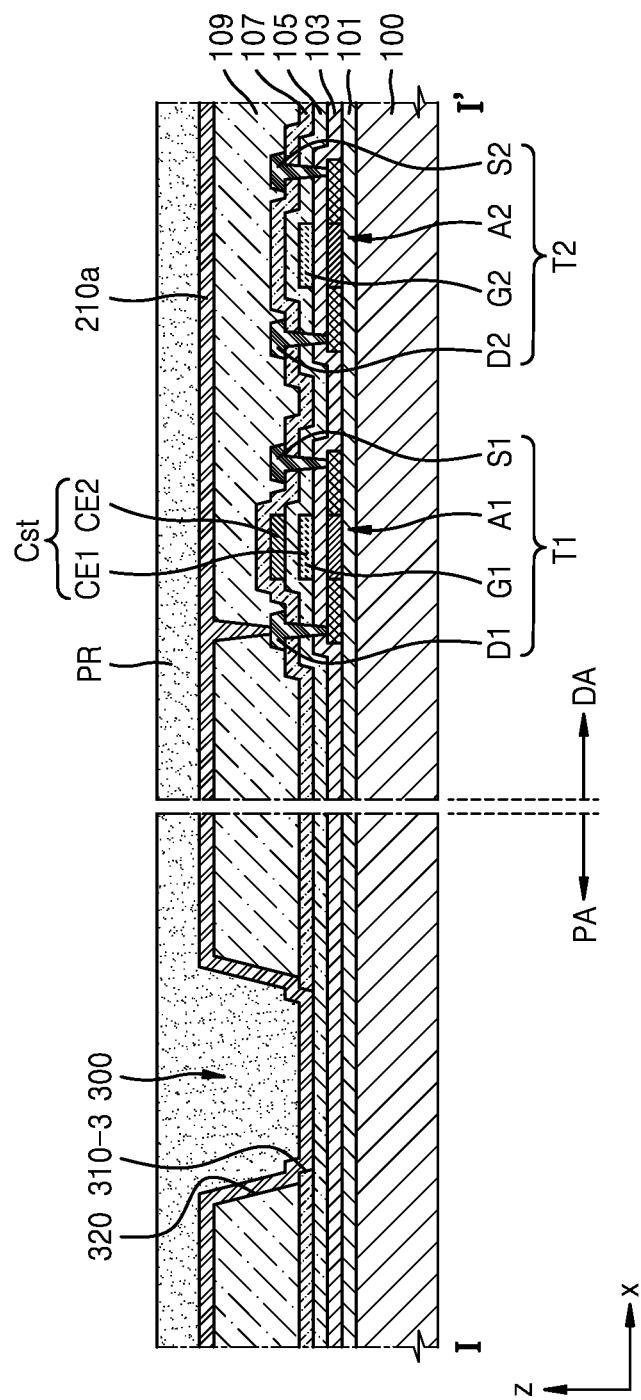

Subsequently, as illustrated in FIG. 6, in order to pattern the pixel electrode material 210a into the pixel electrode 210, a photoresist material PR may be applied onto the pixel electrode material 210a over the surface of the substrate 100. The photoresist material PR may include polymethyl methacrylate, naphthquinone diazide, polybutene-1-sulfone, or the like, or a combination thereof as a positive photoresist but is not limited thereto.

Figure 7:
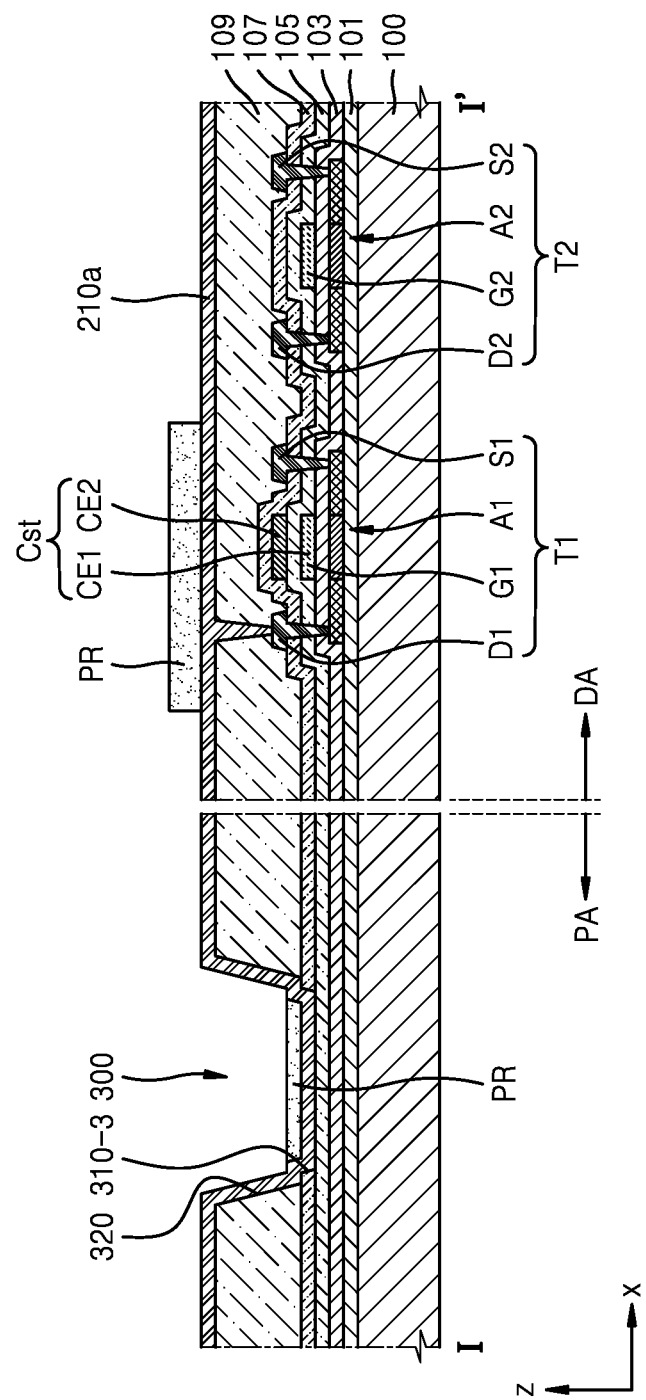

Subsequently, as illustrated in FIG. 7, a mask process may be performed to pattern the photoresist material PR. In the mask process, the photoresist material PR may be removed from a portion where the exposure energy may be transmitted, and the photoresist material PR may not be removed from a portion where the exposure energy may be blocked by the mask. The opening portion 300 may have a relatively deep valley, and sufficient exposure energy may not be transmitted to the bottom surface of the opening portion 300. Accordingly, the photoresist material PR filling the opening portion 300 may not be completely removed and may remain on the bottom surface of the opening portion 300.

Figure 8:
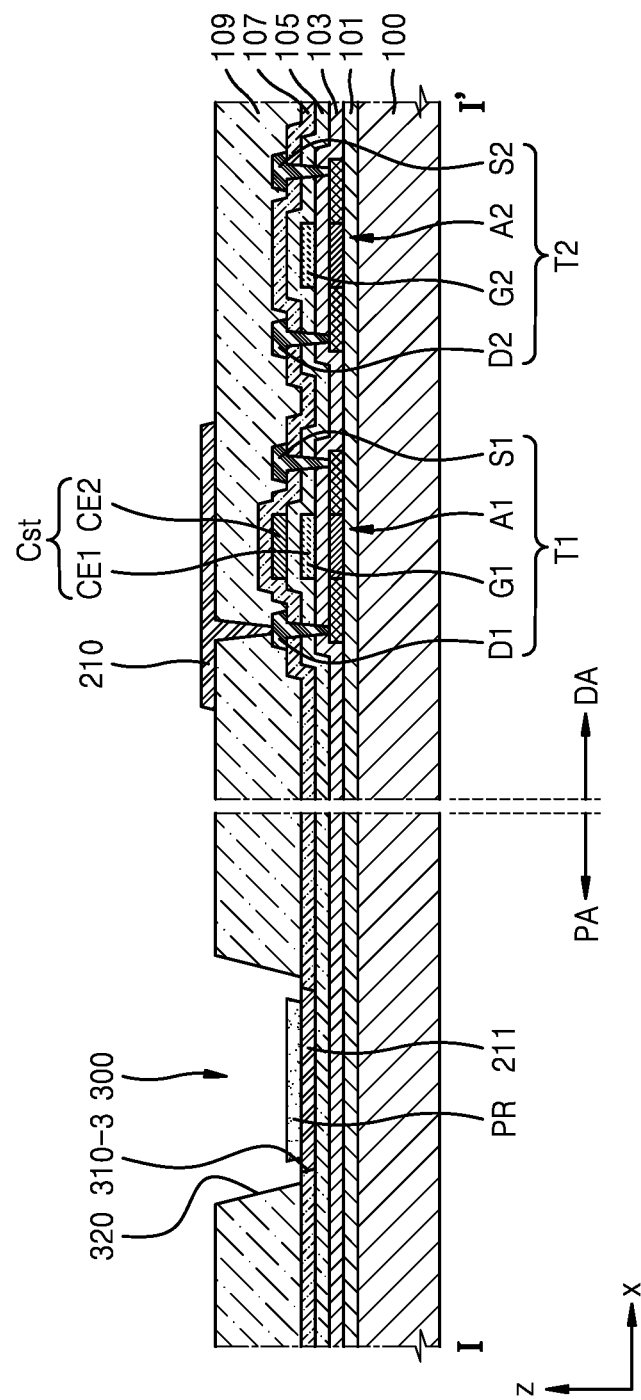

Subsequently, as illustrated in FIG. 8, a process of patterning the pixel electrode material 210a into the pixel electrode 210 may be performed. At least a portion of the pixel electrode material 210a covering the bottom surface of the opening portion 300 may not be completely removed due to the residual photoresist material PR located on the bottom surface of the opening portion 300 remaining in the mask process of FIG. 7. Accordingly, the pixel electrode material may not be removed and the pixel electrode material residual film 211 may remain on the bottom surface of the opening portion 300.

Figure 9:
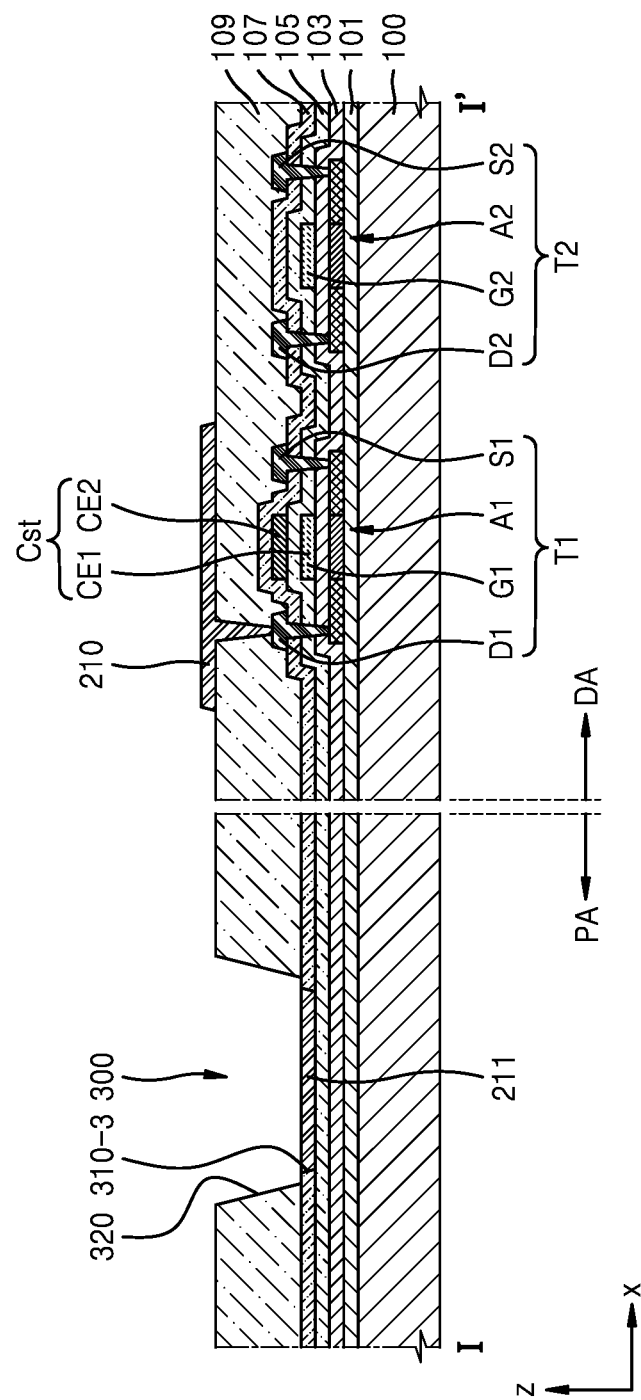

Subsequently, as illustrated in FIG. 9, a process of removing the photoresist material PR may be performed. The process of removing the photoresist material PR may be a lift-off process, a strip process, or the like but is not limited thereto.

As such, in case that a display apparatus is manufactured by performing a subsequent process with the pixel electrode material residual film 211 formed, a metal material (e.g., Ag or the like) included in the pixel electrode material remaining film 211 may move to the display area DA in a particle state, thus causing a defect in the manufacturing process or in the use process after manufacturing.

The display apparatus according to certain embodiments may prevent the formation of the pixel electrode material residual film 211 by including the pattern portion 400 (see FIG. 10) overlapping the opening portion 300. Particularly, the pattern portion 400 may be located on a layer arranged under the organic insulating layer 109 to overlap the openings included in the opening portion 300, such that a step may be formed to correspond to the opening portion 300. For example, a step may be formed by the thickness of the pattern layer(s) included in the pattern portion 400 such that the bottom surface of the opening portion 300 may be raised. More specifically, in the layer exposed by the opening portion 300, the distance from the upper surface of the portion overlapping the opening portion 300 to the upper surface of the substrate 100 is greater than the distance from the upper surface of the portion not overlapping the opening portion 300 to the upper surface of the substrate 100. Accordingly, the depth of the opening portion 300 may be reduced and the exposure energy may be sufficiently transmitted to the bottom surface of the opening portion 300 such that the pixel electrode material residual film 211 may not be formed on the bottom surface of the opening portion 300.

Hereinafter, embodiments of the pattern portion 400 included in the display apparatus will be described in detail with reference to FIGS. 10 to 15, in which like reference numerals in the drawings may denote like elements and redundant descriptions thereof will be omitted for conciseness.

Figure 10:
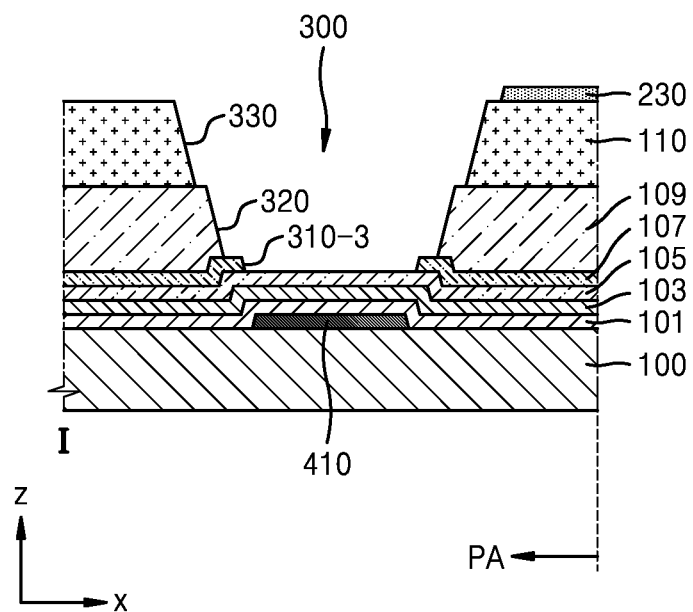
FIG. 10 is a cross-sectional view schematically illustrating a portion of a display apparatus according to an embodiment.

FIG. 10 is a cross-sectional view schematically illustrating a portion of a display apparatus according to an embodiment.

As illustrated in FIG. 10, the opening portion 300 may include a 1-3th opening 310-3 formed in the third inorganic insulating layer 107, a second opening 320 formed in the organic insulating layer 109, and a third opening 330 formed in the pixel definition layer 110. Also, the pattern portion 400 may include a first pattern layer 410.

FIG. 10 illustrates a case where the opening portion 300 may include the 1-3th opening 310-3 that may be the first opening 310 formed in the inorganic insulating layer, the second opening 320 formed in the organic insulating layer 109, and the third opening 330 formed in the pixel definition layer 110. However, the first opening 310 included in the opening portion 300 is not limited thereto. For example, the first opening 310 may include the 1-3th opening 310-3 formed in the third inorganic insulating layer 107, may include the 1-2th opening 310 formed in the second inorganic insulating layer 105 and the 1-3th opening 310-3 formed in the third inorganic insulating layer 107, may include the 1-1th opening 310-1 formed in the first inorganic insulating layer 103, the 1-2th opening 310-2 formed in the second inorganic insulating layer 105, and the 1-3th opening 310-3 formed in the third inorganic insulating layer 107, or variations thereof. This may also be similarly applied to embodiments described below.

The first pattern layer 410 may be located on the substrate 100 and may be covered with the buffer layer 101 located between the substrate 100 and the first inorganic insulating layer 103. The first pattern layer 410 may overlap the 1-3th opening 310-3, the second opening 320, and the third opening 330. Accordingly, the upper surface of the second inorganic insulating layer 105 exposed through the 1-3th opening 310-3, which may be the bottom surface of the opening portion 300, may be located relatively higher in the opening portion 300. The first pattern layer 410 may include a black matrix, a black pigment, a metal material, or the like, or a combination thereof.

In an embodiment, the first pattern layer 410 and a bottom metal layer BML arranged to protect the semiconductor layer in the display area DA may include a same material and may be located on a same layer. Thus, the first pattern layer 410 and the bottom metal layer BML may be simultaneously patterned and formed in one process.

Figure 11:
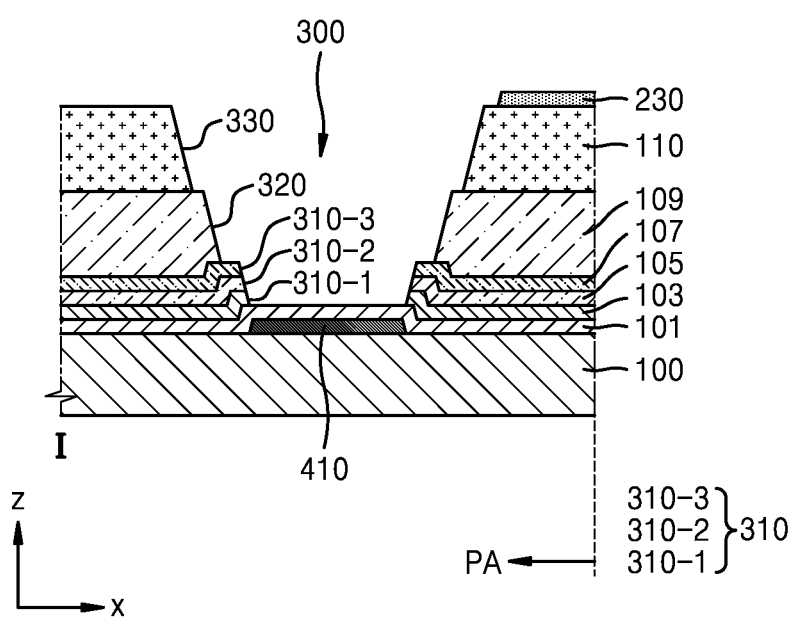
FIG. 11 is a cross-sectional view schematically illustrating a portion of a display apparatus according to another embodiment.

FIG. 11 is a cross-sectional view schematically illustrating a portion of a display apparatus according to another embodiment.

FIG. 11 illustrates a case where the opening portion 300 may include a 1-1th opening 310-1, a 1-2th opening 310-2, and a 1-3th opening 310-3, which may be first openings 310 formed in the inorganic insulating layer, a second opening 320 formed in the organic insulating layer 109, and a third opening 330 formed in the pixel definition layer 110.

The pattern portion 400 may include a first pattern layer 410. The first pattern layer 410 may be located on the substrate 100 and may overlap the openings 310-1, 310-2, 310-3, 320, and 330 included in the opening portion 300 to form a step. Also, because the first pattern layer 410 may be covered by the buffer layer 101, the first pattern layer 410 may not be exposed through the opening portion 300 and a portion of the buffer layer 101 including an insulating material may be exposed, thereby preventing the occurrence of a defect.

Figure 12:
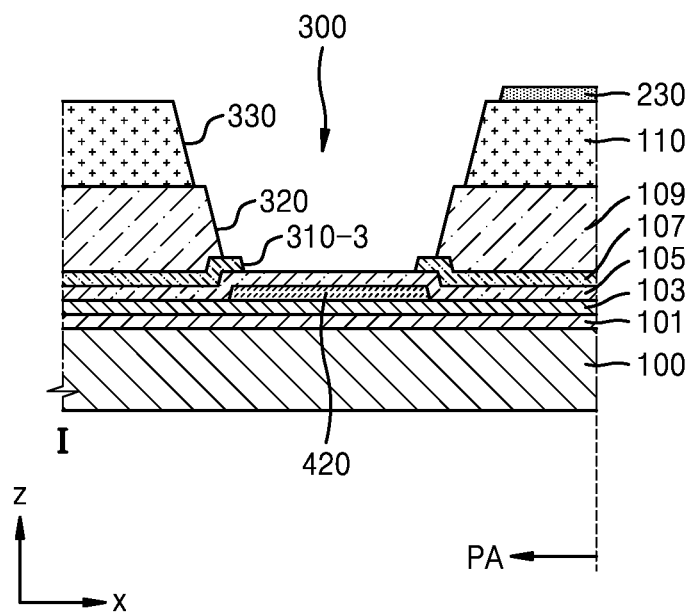
FIG. 12 is a cross-sectional view schematically illustrating a portion of a display apparatus according to another embodiment.

FIG. 12 is a cross-sectional view schematically illustrating a portion of a display apparatus according to another embodiment.

As illustrated in FIG. 12, the opening portion 300 may include a 1-3th opening 310-3, a second opening 320, and a third opening 330. Also, the pattern portion 400 may include a second pattern layer 420.

The second pattern layer 420 may be located on the first inorganic insulating layer 103 and may overlap the openings 310-3, 320, and 330 included in the opening portion 300 to form a step. Also, because the second pattern layer 420 may be covered by the second inorganic insulating layer 105, the second pattern layer 420 may not be exposed through the opening portion 300 and a portion of the second inorganic insulating layer 105 including an insulating material may be exposed, thereby preventing the occurrence of a defect.

The second pattern layer 420 and the gate electrode may include a same material and may be located on a same layer. Thus, the second pattern layer 420 and the gate electrode may be simultaneously patterned and formed in one process.

In an embodiment, unlike the illustration of FIG. 12, the 1-2th opening 310-2 may be formed also in the second inorganic insulating layer 105. The upper surface of the second pattern layer 420 may be exposed through the 1-2th opening 310-2. Thus, the second pattern layer 420 may have a multilayer structure including an ITO layer covering a metal material.

Figure 13:
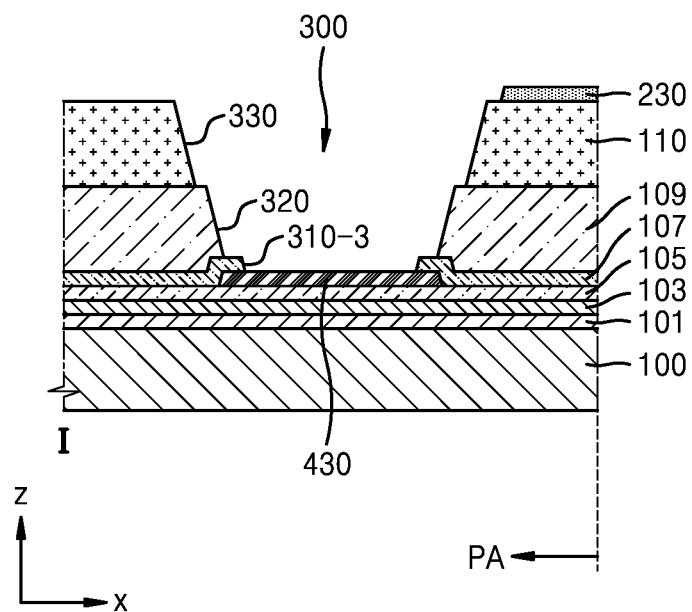
FIG. 13 is a cross-sectional view schematically illustrating a portion of a display apparatus according to another embodiment.

FIG. 13 is a cross-sectional view schematically illustrating a portion of a display apparatus according to another embodiment.

As illustrated in FIG. 13, the opening portion 300 may include a 1-3th opening 310-3, a second opening 320, and a third opening 330. Also, the pattern portion 400 may include a third pattern layer 430.

The third pattern layer 430 may be located on the second inorganic insulating layer 105 and may overlap the openings 310-3, 320, and 330 included in the opening portion 300 to form a step. The upper surface of the third pattern layer 430 may be exposed through the 1-3th opening 310-3. Thus, the third pattern layer 430 may have a multilayer structure including an ITO layer covering a metal material.

The third pattern layer 430, the source electrode and the drain electrode may include a same material and may be located on a same layer. Thus, the third pattern layer 430 and the source electrode and the drain electrode may be simultaneously patterned and formed in one process.

Figure 14:
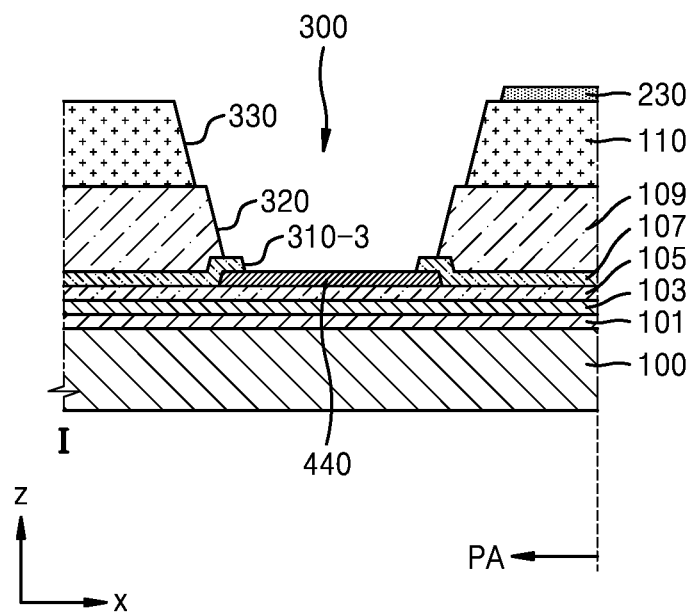
FIG. 14 is a cross-sectional view schematically illustrating a portion of a display apparatus according to another embodiment.

FIG. 14 is a cross-sectional view schematically illustrating a portion of a display apparatus according to another embodiment.

As illustrated in FIG. 14, the opening portion 300 may include a 1-3th opening 310-3, a second opening 320, and a third opening 330. Also, the pattern portion 400 may include a fourth pattern layer 440.

The fourth pattern layer 440 may be located on the second inorganic insulating layer 105 and may overlap the openings 310-3, 320, and 330 included in the opening portion 300 to form a step. The upper surface of the fourth pattern layer 440 may be exposed through the 1-3th opening 310-3. Thus, the fourth pattern layer 440 may have a multilayer structure including an ITO layer covering a metal material.

The fourth pattern layer 440 and the upper electrode CE2 of the storage capacitor Cst may include a same material and may be located on a same layer. Thus, the fourth pattern layer 440 and the upper electrode CE2 may be simultaneously patterned and formed in one process.

Figure 15:
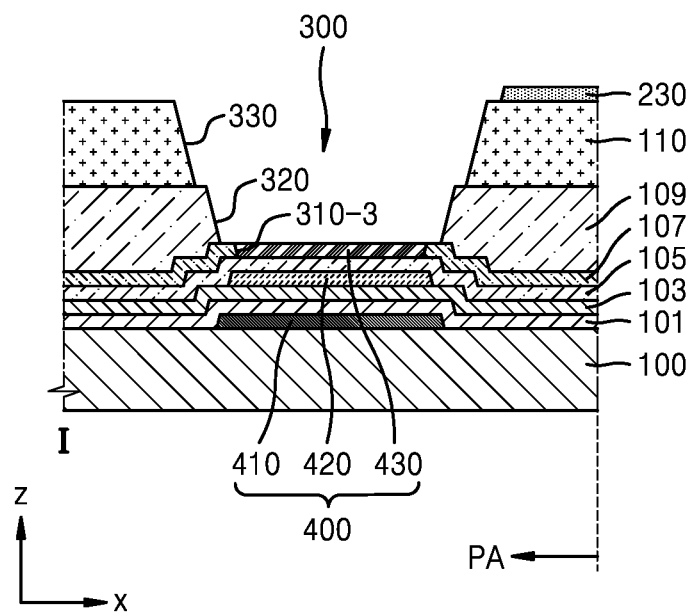
FIG. 15 is a cross-sectional view schematically illustrating a portion of a display apparatus according to another embodiment.

FIG. 15 is a cross-sectional view schematically illustrating a portion of a display apparatus according to another embodiment.

The pattern portion 400 may include at least two of the first pattern layer 410, the second pattern layer 420, the third pattern layer 430, and the fourth pattern layer 440 described above.

Although FIG. 15 illustrates that the pattern portion 400 may include the first pattern layer 410, the second pattern layer 420, and the third pattern layer 430, the disclosure is not limited thereto. For example, the pattern portion 400 may include two pattern layers such as including the first pattern layer 410 and the second pattern layer 420, including the first pattern layer 410 and the third pattern layer 430, including the first pattern layer 410 and the fourth pattern layer 440, including the second pattern layer 420 and the third pattern layer 430, or including the second pattern layer 420 and the fourth pattern layer 440. Also, the pattern portion 400 may include three pattern layers such as including the first pattern layer 410, the second pattern layer 420, and the third pattern layer 430 or including the first pattern layer 410, and the second pattern layer 420, and the fourth pattern layer 440.

Moreover, in each of the cases, various combinations of the openings included in the first opening 310 formed in the inorganic insulating layer described above may be applied.

As such, in case that the pattern portion 400 includes multiple pattern layers, a larger step may be formed compared with the case where only one pattern layer may be included. Also, as the step increases, the height at which the bottom surface of the opening portion 300 may be located may increase and the depth of the opening portion 300 may decrease, and accordingly, the exposure energy reaching the bottom surface of the opening portion 300 may increase and thus the formation of the pixel electrode material residual film 211 may be prevented.

Although only the display apparatus has been described above, the disclosure is not limited thereto. For example, a method of manufacturing the display apparatus will also be within the scope of the disclosure.

According to an embodiment described above, it may be possible to implement a display apparatus capable of minimizing the occurrence of defects in a manufacturing process or a use process after manufacturing. However, the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. A display apparatus comprising:
    a substrate including a display area and a peripheral area adjacent to the display area;
    a thin film transistor arranged in the display area and including a semiconductor layer, a gate electrode, a source electrode, and a drain electrode;
    a first inorganic insulating layer located on the substrate and under the gate electrode and covering the semiconductor layer;
    a second inorganic insulating layer located on the first inorganic insulating layer and covering the gate electrode;
    a third inorganic insulating layer located on the second inorganic insulating layer and including a third inorganic insulating layer opening in the peripheral area;
    an organic insulating layer located on the third inorganic insulating layer, covering the source electrode and the drain electrode, and including a second opening overlapping the third inorganic insulating layer opening in the peripheral area; and
    a pattern portion located on a layer under the organic insulating layer and overlapping the third inorganic insulating layer opening and the second opening, wherein
    the third inorganic insulating layer opening is not filled with an organic material,
    the pattern portion overlaps the first inorganic insulating layer and/or the second inorganic insulating layer between the substrate and the third inorganic insulating layer opening of the third inorganic insulating layer, and
    respective portions of the first inorganic insulating layer and/or the second inorganic insulating layer overlapping the patterned portion have an overlapping portion including a top surface elevated above a top surface of a non-overlapping portion by a height as high as a height of the pattern portion.

2. The display apparatus of claim 1, wherein
    the pattern portion includes a first pattern layer arranged on the substrate, and
    the display apparatus comprises a buffer layer located between the substrate and the first inorganic insulating layer and covering the first pattern layer in the peripheral area.

3. The display apparatus of claim 2, wherein the semiconductor layer is located on the buffer layer.

4. The display apparatus of claim 1, wherein
    the pattern portion includes a second pattern layer, and
    the second pattern layer and the gate electrode are arranged on a same layer.

5. The display apparatus of claim 4, wherein the second pattern layer and the gate electrode include a same material.

6. The display apparatus of claim 1, wherein
the pattern portion includes a third pattern layer, and
the third pattern layer, the source electrode, and the drain electrode are located on a same layer.

7. The display apparatus of claim 6, wherein the third pattern layer, the source electrode, and the drain electrode include a same material.

8. The display apparatus of claim 1, further comprising:
a pixel electrode electrically connected to the thin film transistor in the display area and located on the organic insulating layer; and
a pixel definition layer located on the organic insulating layer over the display area and the peripheral area,
wherein the pixel definition includes a third opening overlapping the third inorganic insulating layer opening and the second opening in the peripheral area.

9. A display apparatus comprising:
a substrate including a display area and a peripheral area adjacent to the display area;
at least one inorganic insulating layer on the substrate;
an organic insulating layer on the at least one inorganic insulating layer;
an opening portion located in the peripheral area and including:
a first opening in the at least one inorganic insulating layer; and
a second opening in the organic insulating layer; and
a pattern portion located in the peripheral area and overlapping the opening portion,
wherein in a layer exposed by the opening portion, a distance from an upper surface of a portion overlapping the opening portion to an upper surface of the substrate is greater than a distance from an upper surface of the portion not overlapping the opening portion to an upper surface of the substrate, wherein
the first opening in the at least one inorganic insulating layer is not filled with an organic material,
the pattern portion overlaps at least one inorganic insulating layer between the substrate and the opening, and
a portion of the at least one inorganic insulating layer overlapping the pattern portion has an overlapping portion including a top surface elevated above a top surface of a non-over-lapping portion by a height as high as the pattern portion.

10. The display apparatus of claim 9, wherein the at least one inorganic insulating layer includes at least one of:
a first inorganic insulating layer on the substrate;
a second inorganic insulating layer on the first inorganic insulating layer; and
a third inorganic insulating layer on the second inorganic insulating layer,
wherein the first opening includes at least one of:
a first inorganic insulating layer opening in the first inorganic insulating layer;
a second inorganic insulating layer opening in the second inorganic insulating layer; and
a third inorganic insulating layer opening in the third inorganic insulating layer.

11. The display apparatus of claim 10, wherein the layer exposed by the opening portion is the first inorganic insulating layer, the second inorganic insulating layer or the third inorganic insulating layer.

12. The display apparatus of claim 10, further comprising:
a thin film transistor located in the display area and including a semiconductor layer, a gate electrode, a source electrode, and a drain electrode, wherein
the first inorganic insulating layer covers the semiconductor layer, the second inorganic insulating layer covers the gate electrode, and the third inorganic insulating layer covers the source electrode and the drain electrode.

13. The display apparatus of claim 10, wherein the pattern portion includes at least one of:
a first pattern layer on the substrate;
a second pattern layer on the first inorganic insulating layer; and
a third pattern layer on the second inorganic insulating layer.

14. The display apparatus of claim 13, further comprising:
a thin film transistor located in the display area and including a semiconductor layer, a gate electrode, a source electrode, and a drain electrode, wherein
the second pattern layer and the gate electrode include a same material, and
the third pattern layer, the source electrode, and the drain electrode include a same material.

15. The display apparatus of claim 9, further comprising a pixel electrode on the organic insulating layer, wherein
there is no residual film including a same material as the pixel electrode on the layer exposed by the opening portion.

* * * * *